United States Patent
Yang et al.

(10) Patent No.: US 6,806,157 B2
(45) Date of Patent: Oct. 19, 2004

(54) METAL OXIDE SEMICONDUCTOR FIELD EFFECT TRANSISTOR FOR REDUCING RESISTANCE BETWEEN SOURCE AND DRAIN AND METHOD FOR FABRICATING THE SAME

(75) Inventors: Jeong-hwan Yang, Yongin (KR); Young-wug Kim, Suwon (KR)

(73) Assignee: Samsung Electronics Co., Ltd. (KR)

( * ) Notice: Subject to any disclaimer, the term of this patent is extended or adjusted under 35 U.S.C. 154(b) by 38 days.

(21) Appl. No.: 10/375,437

(22) Filed: Feb. 27, 2003

(65) Prior Publication Data

US 2003/0162359 A1 Aug. 28, 2003

Related U.S. Application Data

(62) Division of application No. 09/800,554, filed on Mar. 7, 2001, now Pat. No. 6,548,877.

(30) Foreign Application Priority Data

Jul. 22, 2000 (KR) ........................................ 2000-42154

(51) Int. Cl.$^7$ ........................ H01L 21/336; H01L 21/44
(52) U.S. Cl. ....................... 438/306; 438/290; 438/649; 438/664; 438/682; 438/683
(58) Field of Search ................................. 438/232, 290, 438/306, 648, 649, 663, 664, 682, 683

(56) References Cited

U.S. PATENT DOCUMENTS

| 6,191,462 B1 | * | 2/2001 | Chen-Hua | 257/408 |
| 6,265,253 B1 | * | 7/2001 | Lukanc et al. | 438/199 |
| 6,287,967 B1 | * | 9/2001 | Hsieh et al. | 438/664 |

* cited by examiner

*Primary Examiner*—Amir Zarabian
*Assistant Examiner*—Pamela E Perkins
(74) *Attorney, Agent, or Firm*—Mills & Onello LLP

(57) ABSTRACT

A MOS field effect transistor for reducing the resistance between a source and a drain includes a gate insulation layer and a gate electrode sequentially formed on a semiconductor substrate includes deep source/drain regions formed in upper portions of the semiconductor substrate at both sides of the gate electrode. Source/drain extension regions are formed in upper portions of the semiconductor substrate extending from the deep source/drain regions toward a channel region below the gate electrode to be thinner than the deep source/drain regions. A first silicide layer having a first thickness is formed on the surface of each of the deep source/drain regions. A second silicide layer having a second thickness thinner than the first thickness of the first silicide layer is formed to extend from the first silicide layer in a predetermined upper portion of each of the source/drain extension regions.

6 Claims, 5 Drawing Sheets

METAL OXIDE SEMICONDUCTOR FIELD EFFECT TRANSISTOR FOR REDUCING RESISTANCE BETWEEN SOURCE AND DRAIN AND METHOD FOR FABRICATING THE SAME

RELATED APPLICATIONS

This application is a divisional of U.S. application Ser. No. 09/800,554, filed on Mar. 7, 2001, now U.S. Pat. No. 6,548,877, the contents of which are incorporated herein in their entirety by reference.

BACKGROUND OF THE INVENTION

1. Field of the Invention

The present invention relates to a metal oxide semiconductor field effect transistor and a method for fabricating the same, and more particularly, to a metal oxide semiconductor field effect transistor for reducing the resistance between a source and a drain using silicide and a method for fabricating the same.

2. Description of the Related Art

FIG. 1 is a sectional view illustrating a conventional metal oxide semiconductor (MOS) field effect transistor. Referring to FIG. 1, a gate insulation layer 110 and a gate electrode 120 are sequentially stacked on a semiconductor substrate 100. A spacer 150 is formed on each side of the gate electrode 120. Deep source/drain regions 130 and source/drain extension regions 140 are formed in the semiconductor substrate 100. A silicide layer 160 may be formed in a predetermined upper portion of each deep source/drain region 130. The concentration of dopant in each source/drain extension region 140 is lower than that of the dopant in each deep source/drain region 130. In addition, the thickness $t_1$ of the source/drain extension regions 140 is less than the thickness $t_2$ of the deep source/drain regions. Formation of the shallow source/drain extension regions 140 is important in restraining a hot carrier effect.

A matter of concern when reducing the size of a MOS field effect transistor due to a reduction in a design rule is the reduction of the length L of the gate electrode 120. When the length L of the gate electrode 120 is reduced, it is necessary to reduce the size of the device in the vertical direction. Accordingly, it is also necessary to reduce the thickness $t_1$ of the source/drain extension regions 140. However, when the thickness $t_1$ of the source/drain extension regions 140 is reduced, the serial resistance between the source and drain increases. To decrease the serial resistance between the source and the drain, the concentration of a dopant in each source/drain extension region 140 should be increased. However, in the case of boron (B) which is a P-type dopant or arsenic (As) which is an N-type dopant, the maximum density is about $3.0 \times 10^{20} - 5.0 \times 10^{20}$ cm$^{-3}$ per unit volume, so there is a limitation in compensating for the increase in the resistance between the source and the drain.

The thickness of the gate spacer 150 as well as the length L of the gate electrode 120 should also be reduced to reduce the size of the device. However, when the thickness of the gate spacer 150 is reduced, the length of each source/drain extension region 140 is also reduced, so a resulting short channel effect may degrade the device characteristics. Accordingly, there is a limitation in reducing the lengths of the source/drain extension regions 140. Moreover, the silicide layer 160 needs to have a predetermined or larger thickness in order to maintain low resistance in the silicide layer 160. Due to the restraint on the reduction of the thickness of the silicide layer 160, the thickness $t_2$ of each deep source/drain region 130 needs to be a predetermined or larger thickness.

In conclusion, resistance in a channel region formed between the source/drain extension regions 140 can be decreased by reducing the length L of the gate electrode, but it is not easy to reduce resistance in the source/drain extension regions 140 and the deep source/drain regions 130 due to restraint on the reduction of the lengths of the source/drain extension regions 140 and restraint on the reduction of the thicknesses of the deep source/drain regions 130. Accordingly, even if the resistance in the channel region is reduced, resistance in the source/drain extension regions 140 and the deep source/drain regions 130, the size ratios of which tend to increase in a device, is not reduced so that the resistance of the entire device rarely decreases.

SUMMARY OF THE INVENTION

To address the above limitations, it is a first object of the present invention to provide a metal oxide semiconductor (MOS) field effect transistor in which the resistance between a source and a drain is reduced using silicide.

It is a second object of the present invention to provide a method for fabricating the MOS field effect transistor by which the resistance between a source and a drain is reduced.

Accordingly, to achieve the first object of the invention, there is provided a MOS field effect transistor for reducing the resistance between a source and a drain. The MOS field effect transistor includes a gate insulation layer and a gate electrode sequentially formed on a semiconductor substrate. Deep source/drain regions are formed in upper portions of the semiconductor substrate at both sides of the gate electrode. Source/drain extension regions formed in upper portions of the semiconductor substrate extending from the deep source/drain regions toward a channel region below the gate electrode to be thinner than the deep source/drain regions. A first silicide layer portion having a first thickness is formed on the surface of each of the deep source/drain regions. A second silicide layer portion having a second thickness thinner than the first thickness of the first silicide layer is formed to extend from the first silicide layer portion in a predetermined upper portion of each of the source/drain extension regions.

It is preferable that each of the source/drain extension regions includes first source/drain extension regions, and second source/drain extension regions provided between the first source/drain extension regions and corresponding deep source regions. The second source/drain extension regions are preferably deeper than the first source/drain extension regions and shallower than the deep source/drain regions. The second silicide layer portion is preferably formed in the upper portion of each of the second source/drain extension regions.

The MOS field effect transistor may further includes spacers formed at the sidewalls of the gate insulation layer and the gate electrode. Here, it is preferable that the lengths of the first source/drain extension regions are defined by the thickness of the spacers.

The first and second silicide layer portions preferably form a step shape. The second silicide layer portion is preferably a cobalt silicide layer, a titanium silicide layer, a nickel silicide layer, a tungsten silicide layer, a platinum silicide layer, a hafnium silicide layer or a palladium silicide layer.

To achieve the second object of the invention, there is provided a method for fabricating a MOS field effect transistor having a gate insulation layer and a gate electrode sequentially formed on a semiconductor substrate. The method includes the steps of forming first source/drain extension regions in the semiconductor substrate by implanting impurity ions using the gate electrode as an ion-implantation mask, forming first spacers on the sidewalls of the gate electrode and the gate insulation layer, forming second source/drain extension regions deeper than the first source/drain extension regions by performing impurity ion-implantation using the first spacers and the gate electrode as an ion-implantation mask, forming second spacers on the outer walls of the first spacers, forming deep source/drain regions deeper than the second source/drain extension regions by performing impurity ion-implantation using the second spacers and the gate electrode as an ion-implantation mask, forming a first silicide layer portion having a first thickness in the upper portion of each of the deep source/drain regions, removing the second spacers to expose the surfaces of the second source/drain extension regions, and forming a second silicide layer portion having a second thickness in the upper portion of each of the exposed second source/drain extension regions.

Preferably, the second spacers are formed of a material that can be selectively etched with respect to the first spacers.

It is preferable that the step of forming the first silicide layer portion includes the steps of forming a metal layer on the entire surface of the resultant structure having the second spacers, forming the first silicide layer between the metal layer and each of the deep source/drain regions by performing an annealing process, and removing the metal layer that has not reacted with the deep source/drain regions. The metal layer is preferably a cobalt layer, a titanium layer, a nickel layer, a tungsten layer, a platinum layer, a hafnium layer or a palladium layer.

The second silicide layer portion may include a cobalt silicide layer, a titanium silicide layer, a nickel silicide layer, a tungsten silicide layer, a platinum silicide layer, a hafnium silicide layer or a palladium silicide layer. It is preferable that when the second silicide layer portion is a cobalt silicide layer or a titanium silicide layer, the step of forming the second silicide layer includes the steps of forming a metal layer formed of cobalt or titanium on the entire surface of the resultant structure in which the second source/drain extension regions are exposed so that a silicide layer is naturally formed between the metal layer and each of the second source/drain extension regions, transferring the phase of the naturally formed silicide layer by performing an annealing process, and removing the metal layer that has not reacted with the second source/drain extension regions.

BRIEF DESCRIPTION OF THE DRAWINGS

The above objectives and advantages of the present invention will become more apparent by describing in detail preferred embodiments thereof with reference to the attached drawings in which.

DETAILED DESCRIPTION OF PREFERRED EMBODIMENTS

Hereinafter, embodiments of the present invention will be described in detail with reference to the attached drawings. The present invention is not restricted to the following embodiments, and many variations are possible within the sprit and scope of the present invention. The embodiments of the present invention are provided in order to more completely explain the present invention to anyone skilled in the art.

Figure 1:
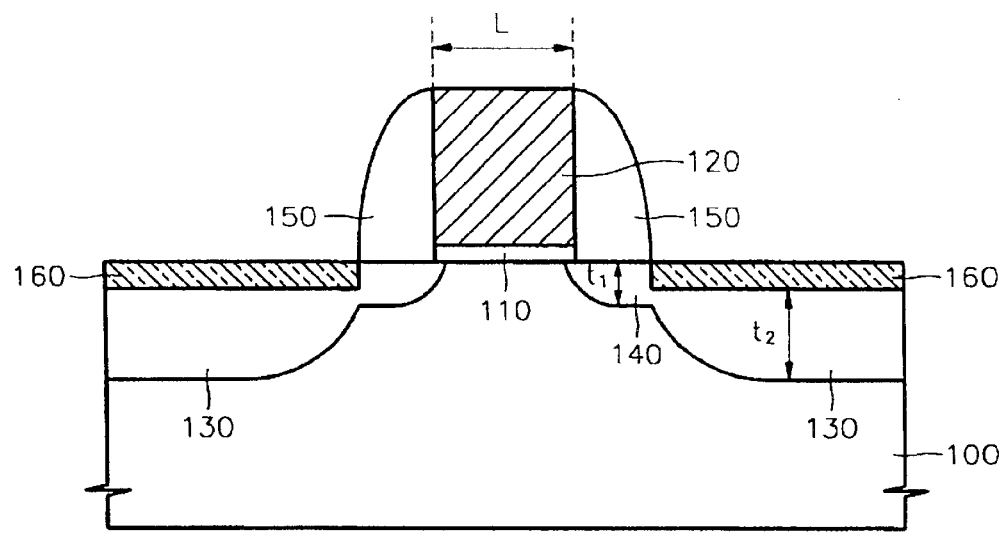
FIG. 1 is a sectional view illustrating a conventional metal oxide semiconductor (MOS) field effect transistor.
Figure 2:
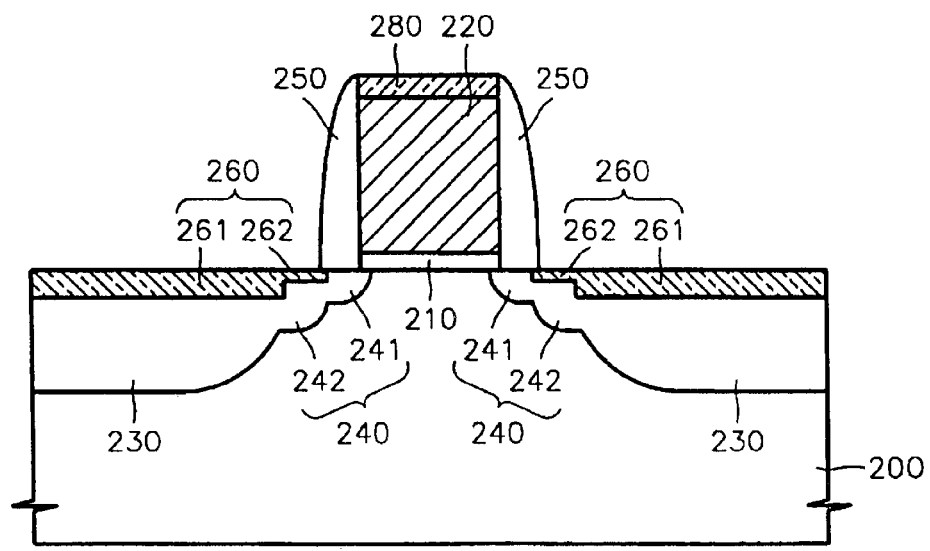
FIG. 2 is a sectional view illustrating a MOS field effect transistor according to the present invention.

Referring to FIG. 2, a gate insulation layer 210 and a gate electrode 220 are sequentially formed on a semiconductor substrate 200. The gate electrode 220 may be formed of polysilicon, for example. A gate spacer 250 is formed at each side of the gate electrode 220. The thickness of the gate spacer 250 is, for example, about 100–500 Å, and the gate spacer 250 may be a single layer formed of a silicon nitride layer or a silicon oxide layer or a dual layer formed of a silicon nitride layer and a silicon oxide layer. A gate silicide layer 280 may be formed at the upper portion of the gate electrode 220.

Deep source/drain regions 230 and source/drain extension regions 240 are formed in the semiconductor substrate 200. Each source/drain extension region 240 includes a first source/drain extension region 241 and a second source/drain extension region 242. For an N-channel MOS field effect transistor, the conductivity type of the semiconductor substrate 200 is P-type, and the conductivity type of each of the deep source/drain regions 230 and the source/drain extension regions 240 is N-type. For a P-channel MOS field effect transistor, the conductivity type of the semiconductor substrate 200 is N-type, and the conductivity type of each of the deep source/drain regions 230 and the source/drain extension regions 240 is P-type. The depth of the deep source/drain regions 230 is deeper than the depth of the source/drain extension regions 240, and the depth of the second source/drain extension regions 242 is deeper than the depth of the first source/drain extension regions 241.

A silicide layer 260 is formed in a predetermined upper portion of each of the deep source/drain regions 230 and the source/drain extension regions 240. The silicide layer 260 is composed of a first silicide layer 261 formed in the upper portion of each of the deep source/drain regions 230 and a second silicide layer 262 partially formed on the upper portion of each of the source/drain extension regions 240. The first silicide layer 261 is connected to the second silicide layer 262, but the thicknesses of the first and second silicide layers 261 and 262 are different. The first silicide layer 261 is thicker than the second silicide layer 262. Accordingly, the silicide layer 260 has a step shape. Each of the first and second silicide layers 261 and 262 may comprise, for example, a cobalt (Co) silicide layer, a titanium (Ti) silicide layer, a nickel (Ni) silicide layer, a tungsten (W) silicide layer, a platinum (Pt) silicide layer, a hafnium (Hf) silicide layer or a palladium (Pd) silicide layer.

By providing the second silicide layer 262 in the upper portion of each of the source/drain extension regions 240, the serial resistance between a source and a drain can be greatly reduced. In other words, even if the length of the gate electrode 220 is decreased in a horizontal direction, and the thickness of each source/drain extension region 240 is decreased in a vertical direction in order to reduce the size of a device, any resulting increase in resistance between the source and the drain is compensated for by the second silicide layer 262, and furthermore, the resistance between the source and the drain is decreased. When the resistance between the source and the drain is decreased, the amount of current that can flow between the source and the drain in the device increases, thereby improving the electrical characteristics of the device.

In addition, the present invention includes the second silicide layer 262 in each source/drain extension region 240, thereby decreasing the thickness of each source/drain extension region 240. To solve a problem of junction leakage currents produced near the junctions between the semiconductor substrate 200 and the source/drain extension regions 240 due to the shallow source/drain extension regions 240, the second silicide layer 262 is formed in each second source/drain extension region 242 relatively thicker than in each of the first source/drain extension regions 241. Since the second source/drain extension regions 242 are thicker than the first source/drain extension regions 241, a decrease in the thickness of each second source/drain extension region 242 due to the second silicide layer 262 can be neglected. Even if the second silicide layer 262 is formed in each second source/drain extension region 242, a sufficient thickness of each second source/drain extension region 242 can be ensured, in order to restrain the production of junction leakage currents. In addition, the presence of the first source/drain extension regions 241 restrains degradation of device characteristics caused by the short channel effect.

Figure 3A:
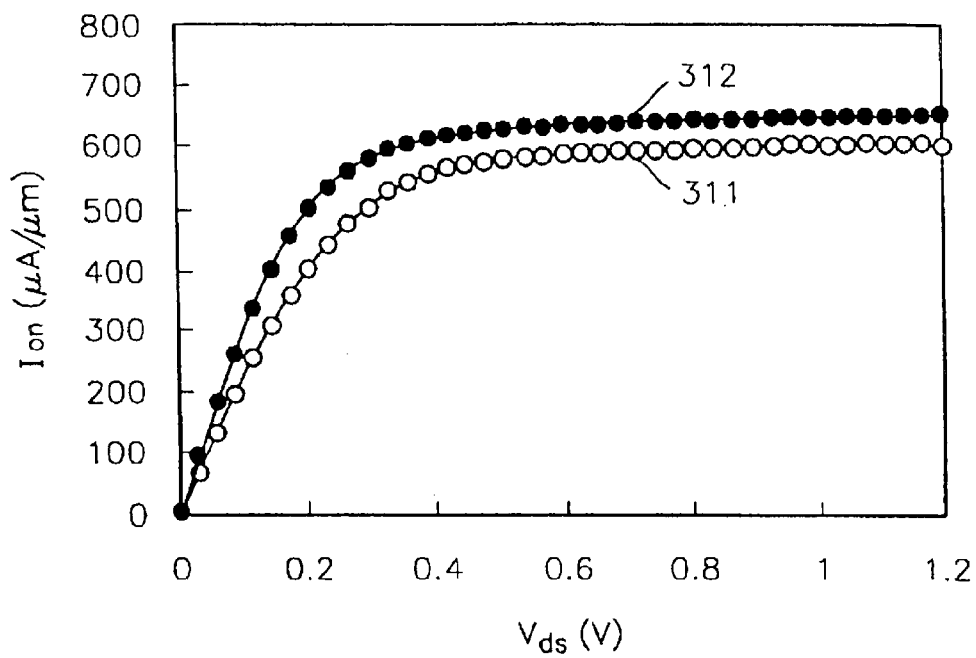
FIG. 3A is a graph illustrating the on-current characteristic of a MOS field effect transistor according to the present invention.
Figure 3B:
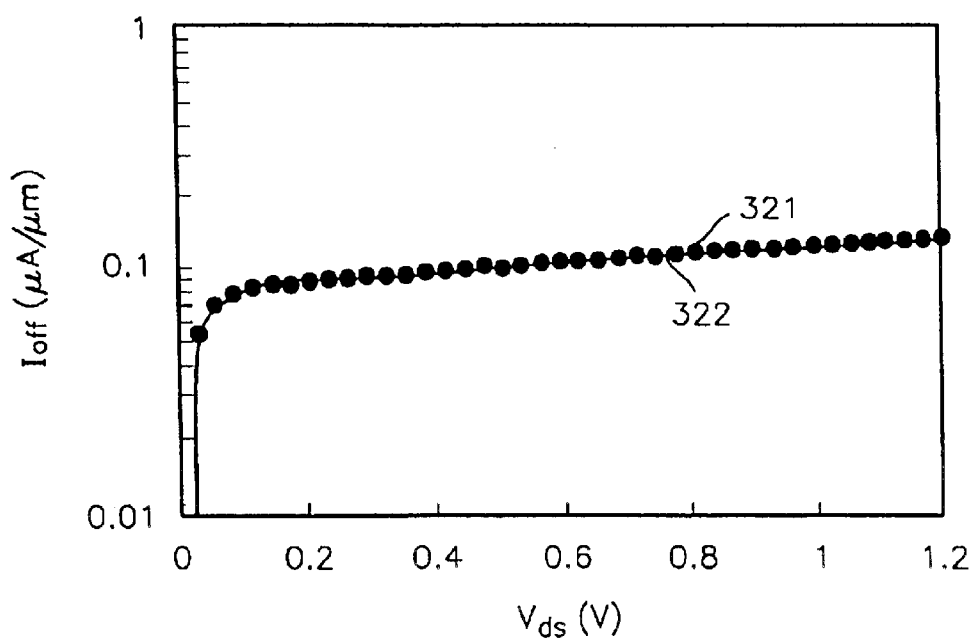
FIG. 3B is a graph illustrating the off-current characteristic of a MOS field effect transistor according to the present invention.

FIG. 3A is a graph illustrating the on-current characteristic of a MOS field effect transistor according to the present invention. FIG. 3B is a graph illustrating the off-current characteristic of a MOS field effect transistor according to the present invention.

In FIG. 3A, as can be seen from graph 311 indicating the characteristics of a conventional MOS field effect transistor, the on-current $I_{on}$ of the device, which depends on a source-drain voltage $V_{ds}$, is about 612 $\mu A/\mu m$ when a voltage of 1.2 V is applied to the gate thereof. On the other hand, as can be seen from graph 312 indicating a MOS field effect transistor including a silicide layer having a step shape according to the present invention, the on-current $I_{on}$ of the device is about 657 $\mu A/\mu m$ when a voltage of 1.2 V is applied to the gate thereof. In other words, in this case, the on-current increases by about 7% in the MOS field effect transistor having a step-shape silicide layer according to the present invention, as compared to the conventional MOS field effect transistor which does not have a step-shape silicide layer. This is because the resistance between the source and drain decreases due to the second silicide layer 262 formed on each source/drain extension region 240.

As shown in FIG. 3B, when a voltage is not applied to a gate electrode, that is, in an off state of a device, an off-current $I_{off}$ corresponding to a source-drain voltage $V_{ds}$ in a MOS field effect transistor 321 having a step-shape silicide layer is about 0.14 $\mu A/\mu m$, which is substantially the same as that in a conventional MOS field effect transistor 322 not including the step-shape silicide layer. Accordingly, it can be seen that existence of the step-shape silicide layer does not change the amount of off-current in the device.

Figure 4:
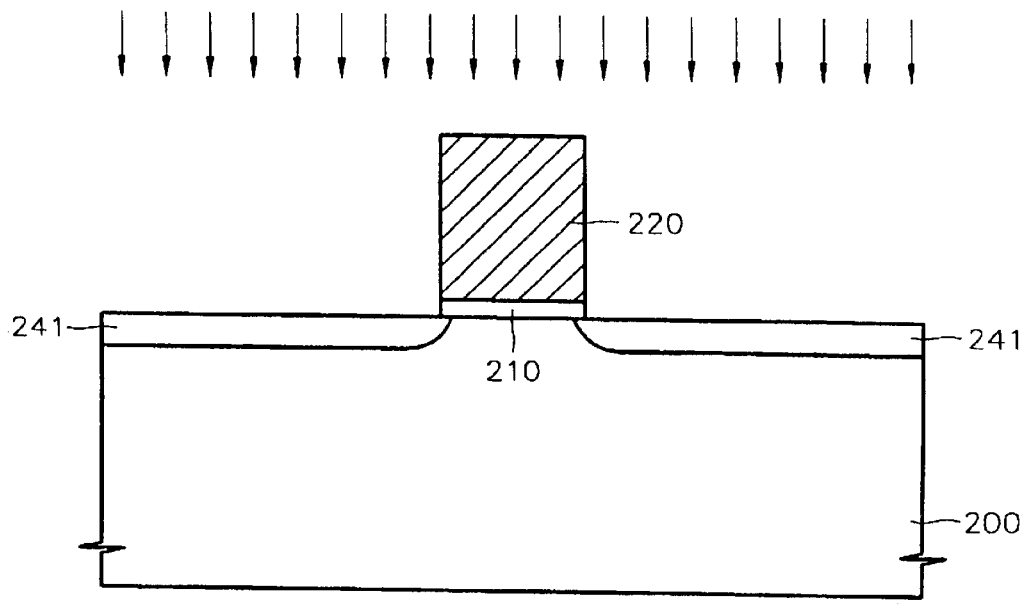
FIGS. 4 through 8 are sectional views illustrating a method for fabricating a MOS field effect transistor according to the present invention.

FIGS. 4 through 8 are sectional views illustrating a method for fabricating a MOS field effect transistor according to the present invention. Referring to FIG. 4, a gate insulation layer 210 and a gate electrode 220 are sequentially formed on an active region defined in a semiconductor substrate 200. In other words, an insulation layer such as an oxide layer is formed on the semiconductor substrate 200. A conductive layer such as a polysilicon layer is formed on the oxide layer. Subsequently, the oxide layer and the polysilicon layer are patterned, thereby forming the gate insulation layer 210 and the gate electrode 220. After forming the gate electrode 220, an oxidation process may be performed on the sidewalls of the gate electrode 220. Here, the thickness of a sidewall oxide layer (not shown) formed on each sidewall of the gate electrode 220 is about 20–1000 Å.

Next, impurity ions having a predetermined conductivity type are implanted into the semiconductor substrate 200 in an ion-implantation process using the gate electrode 220 as an ion-implantation mask. For an N-channel MOS field effect transistor, N-type impurity ions such as arsenic (As) ions are used. Here, the implantation energy is about 1–30 keV, and the implantation concentration is about $1\times10^{14}$–$5\times10^{15}$ cm$^{-2}$. For a P-channel MOS field effect transistor, P-type impurity ions such as boron (B) ions are used. Here, the implantation energy is about 0.2–10 keV, and the implantation concentration is about $1\times10^{14}$–$5\times10^{15}$ cm$^{-2}$. When an annealing process is performed after the implantation of impurity ions, first source/drain extension regions 241 are formed in the semiconductor substrate 200.

Figure 5:
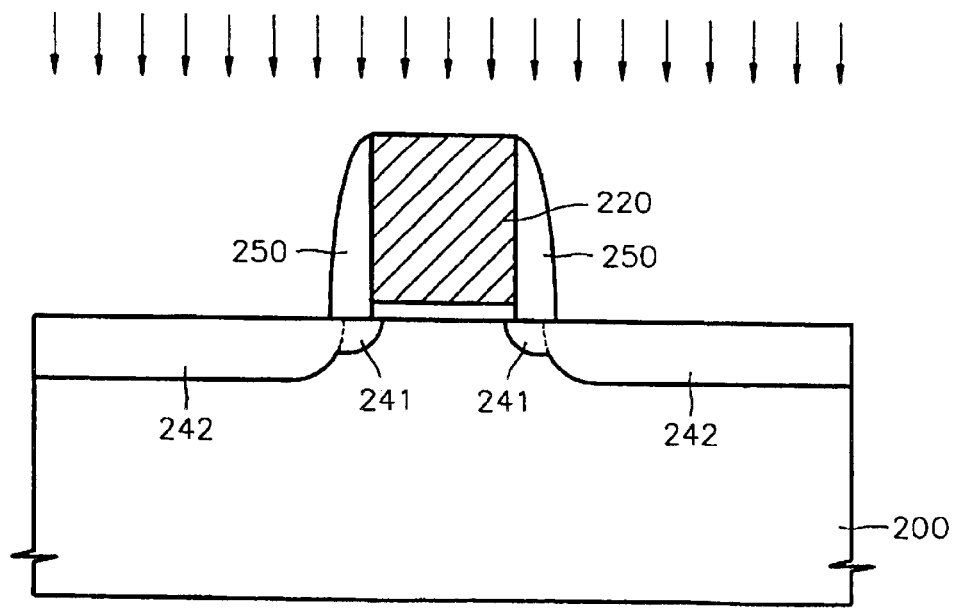

Referring to FIG. 5, a first spacer 250 is formed at each sidewall of the gate electrode 220. The first spacers 250 are formed to protect the first source/drain extension regions 241 below the sidewalls of the gate electrode 220 during a later ion-implantation process. The first spacers 250 also serve to prevent the gate electrode 220 from being electrically connected to source/drain regions during a later silicide process. Each of the first spacers 250 may be a single layer formed of a silicon nitride layer or a silicon oxide layer or a dual layer formed of a silicon nitride layer and a silicon oxide layer. The thickness of the first spacer 250 is about 100–500 Å. To form the first spacers 250, typically, a silicon oxide layer or a silicon nitride layer covering the semiconductor substrate 200 and the gate electrode 220 is formed by a chemical vapor deposition or another well-known method. Subsequently, the silicon oxide layer or the silicon nitride layer is etched back, thereby forming the first spacers 250 on the sidewalls of the gate electrode 220.

Next, impurity ions having a predetermined conductivity type are implanted into the semiconductor substrate 200 by performing an ion-implantation process using the gate electrode 220 and the first spacers 250 as an ion-implantation mask. For an N-channel MOS field effect transistor, N-type impurity ions such as arsenic (As) ions are used. Here, the implantation energy is about 2–50 keV, and the implantation concentration is about $1\times10^{14}$–$5\times10^{15}$ cm$^{-2}$. For a P-channel MOS field effect transistor, P-type impurity ions such as boron (B) ions are used. Here, the implantation energy is about 0.5–20 keV, and the implantation concentration is about $1\times10^{14}$–$5\times10^{15}$ cm$^{-2}$. When an annealing process is performed after the implantation of impurity ions, second source/drain extension regions 242 are formed in the semiconductor substrate 200. Here, since the ion-implantation energy for forming the second source/drain extension regions 242 is higher than that for forming the first source/drain extension regions 241, the second source/drain extension regions 242 are formed to be deeper than the first source/drain extension regions 241.

Figure 6:
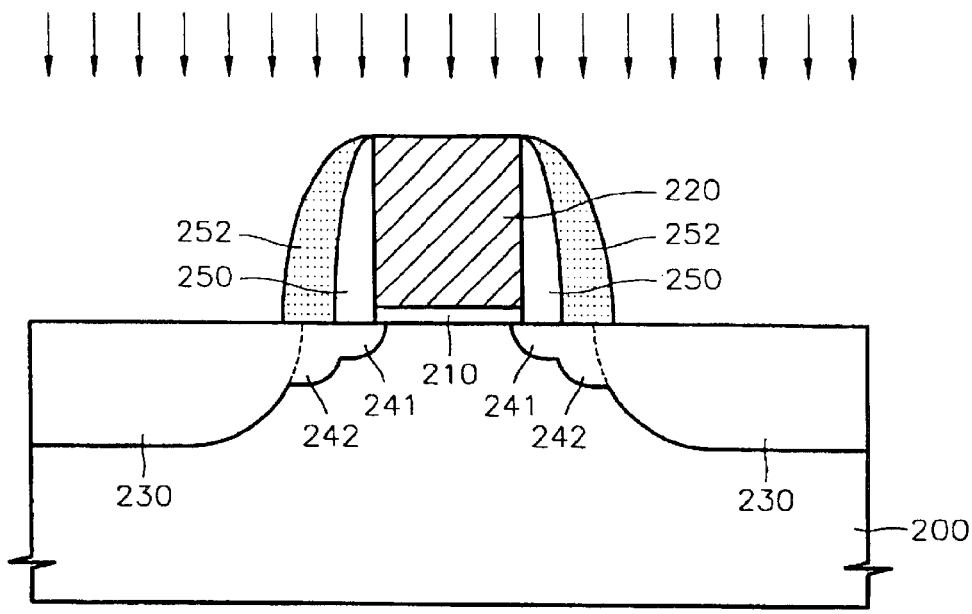

Referring to FIG. 6, a second spacer 252 is formed on the outer wall of each of the first spacers 250. The second spacers 252 are formed of a material having an etching selection ratio with respect to the first spacers 250 so that the second spacers 252 can be easily removed in a later etching process. For example, when the first spacers 250 are formed of a silicon nitride layer, the second spacers 252 are formed of a silicon oxide layer. Similarly, when the first spacers 250 are formed of a silicon oxide layer, the second spacers 252 are formed of a silicon nitride layer. The thickness of each second spacer 252 is about 300–800 Å. The method of forming the second spacers 252 can be the same as that of forming the first spacers 250. In other words, a silicon oxide layer or a silicon nitride layer covering the semiconductor substrate 200, the gate electrode 220 and the first spacers 250 is formed by chemical vapor deposition or another well-known method. Subsequently, an etch-back process is performed, thereby forming the second spacers 252 on the outer walls of the first spacers 250.

Next, impurity ions having a predetermined conductivity type are implanted into the semiconductor substrate 200 by performing an ion-implantation process using the gate electrode 220 and the second spacers 252 as an ion-implantation mask. As described above, for an N-channel MOS field effect transistor, N-type impurity ions are implanted. For a P-channel MOS field effect transistor, P-type impurity ions are implanted. An annealing process is performed after the implantation of impurity ions, thereby forming deep source/drain regions 230. Here, since the impurity ion-implantation energy for forming the deep source/drain regions 230 is higher than that for forming the first and second source/drain extension regions 241 and 242, the deep source/drain regions 230 are formed to be deeper than the first and second source/drain extension regions 241 and 242.

Figure 7:
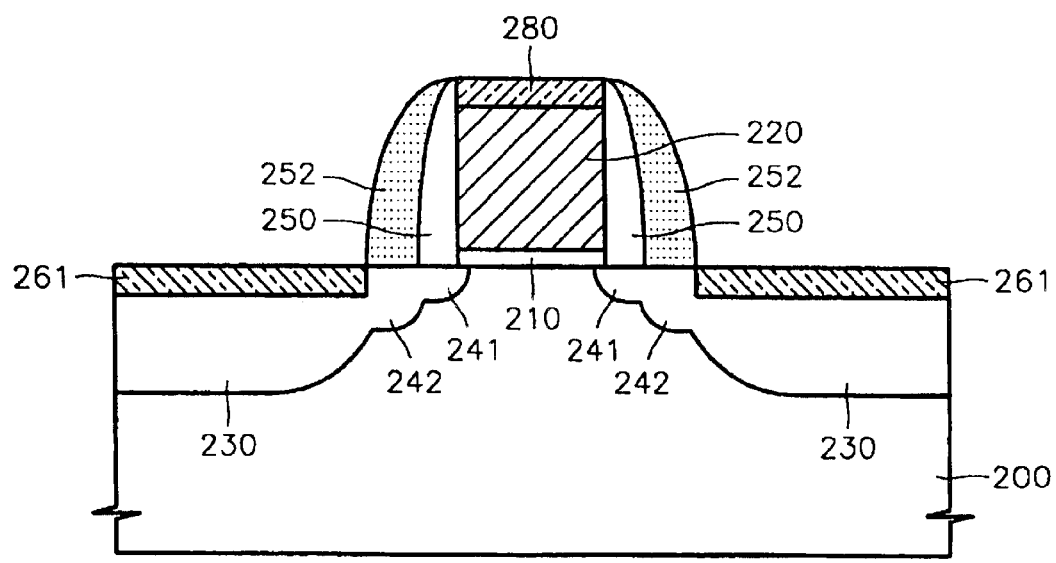

Referring to FIG. 7, a first silicide layer 261 is formed in the upper portion of each deep source/drain region 230, and a gate silicide layer 280 is formed in the upper portion of the gate electrode 220. To form the first silicide layers 261 and the gate silicide layer 280, primarily, a metal layer (not shown) is formed on the entire surface of the structure of FIG. 6. Preferably, the metal layer is formed of cobalt (Co), titanium (Ti), nickel (Ni), tungsten (W), platinum (Pt), hafnium (Hf) or palladium (Pd). After forming the metal layer, a predetermined annealing process is performed. As a result, the first silicide layers 261 are formed in areas where the metal layer contacts the deep source/drain regions 230. The gate silicide layer 280 is formed between the metal layer and the gate electrode 220. The thickness of each first silicide layer 261 can be adjusted by adjusting the thickness of the metal layer so that a desired thickness can be obtained. After forming the first silicide layers 261, the portion of the metal layer which has not reacted is removed by a well-known method.

Figure 8:
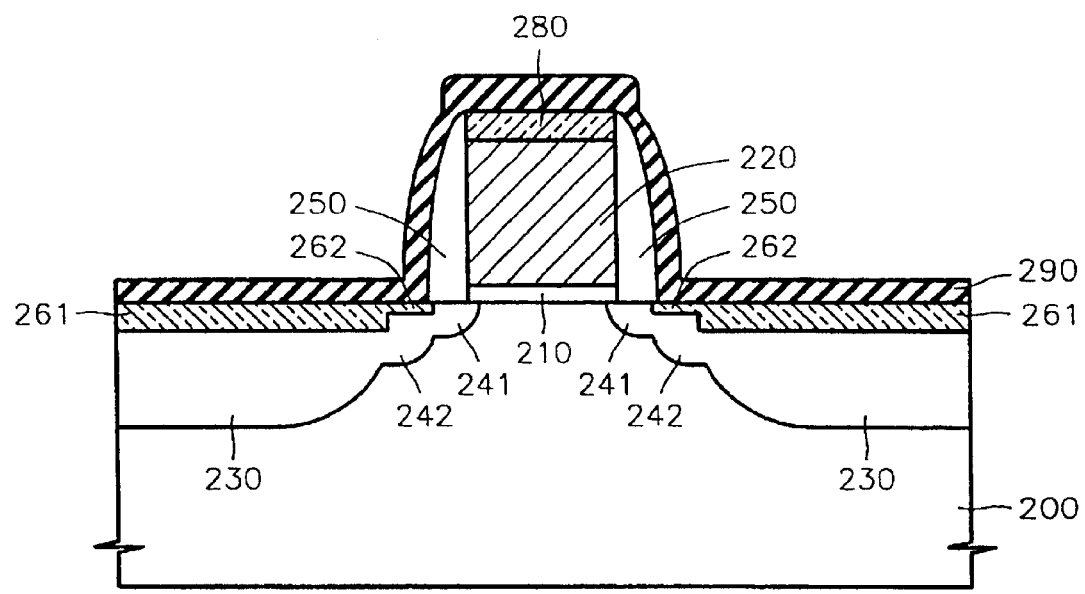

Referring to FIG. 8, the second spacers 252 of FIG. 7 are removed. Since the second spacers 252 are formed of a material having an etching selection ratio with respect to the first spacers 251, they can be easily removed by a wet-etching process. A metal layer 290 is formed on the entire surface of the resultant structure obtained after removing the second spacers 252, and then a second silicide layer 262 is formed in areas where the metal layer 290 contacts the second source/drain extension regions 242.

Preferably, the metal layer 290 is formed of Co, Ti, Ni, W, Pt, Hf or Pd. When the metal layer 290 is formed of Co or Ti, naturally Co silicide layers or Ti silicide layers 262 are formed between the second source/drain extension regions 242 and the Co metal layer or the Ti metal layer 290, because, when silicon contacts Co or Ti, thermodynamic mixing entropy of the atoms and molecules of the contacting materials increases, and thus the atoms and molecules of the contacting materials spread and mix with each other. When the metal layer 290 is formed of Ni, Ni silicide layers 262 are naturally formed between the second source/drain extension regions 242 and the Ni metal layer 290. After forming the second silicide layers 262, the metal layer 290 that does not react with silicon is removed by a well known method. As a result, a MOS field effect transistor according to the present invention, as shown in FIG. 2, is completed.

When the second silicide layers 262 are Co silicide layers or Ti silicide layers, an additional annealing process is performed to transfer the phase of the Co silicide layers or the Ti silicide layers that have been naturally formed. As a result of the phase transfer, the volume of each of the Co silicide layers or the Ti silicide layers increases by about 3 times, and the resistance thereof decreases. When the second silicide layers 262 are Ni silicide layers, an additional annealing process may not be required because the resistance of a naturally formed Ni silicide layer is lower than that of a phase-transferred Ni silicide layer.

As described above, in a MOS field effect transistor for reducing the resistance between a source and a drain according to the present invention, silicide layers are formed in predetermined upper portions of source/drain extension regions as well as deep source/drain regions so that the resistance between the source and the drain can be reduced, and thus the current density between the source and the drain can be increased in an on state of a device. In addition, even if the length of a gate electrode is reduced, an increase in the resistance between the source and the drain can be restrained so that the integration density of the device can be improved.

What is claimed is:

1. A method for fabricating a MOS field effect transistor having a gate insulation layer and a gate electrode sequentially formed on a semiconductor substrate, the method comprising the steps of:

forming first source/drain extension regions in the semiconductor substrate by implanting impurity ions using the gate electrode as an ion-implantation mask;

forming first spacers on the sidewalls of the gate electrode and the gate insulation layer;

forming second source/drain extension regions deeper than the first source/drain extension regions by performing impurity ion-implantation using the first spacers and the gate electrode as an ion-implantation mask;

forming second spacers on outer walls of the first spacers;

forming deep source/drain regions deeper than the second source/drain extension regions by performing impurity ion-implantation using the second spacers and the gate electrode as an ion-implantation mask;

forming a first silicide layer portion having a first thickness in the upper portion of each of the deep source/drain regions;

removing the second spacers to expose the surfaces of the second source/drain extension regions; and forming a second silicide layer portion having a second thickness less than the first thickness and extending from the first silicide layer portion into the upper portion of each of the exposed second source/drain extension regions.

2. The method of claim 1, wherein the second spacers are formed of a material that can be selectively etched with respect to the first spacers.

3. The method of claim 1, wherein the step of forming the first silicide layer portion comprises the steps of:

forming a metal layer on the entire surface of the resultant structure having the second spacers;

forming the first silicide layer portion between the metal layer and each of the deep source/drain regions by performing an annealing process; and removing the metal layer that has not reacted with the deep source/drain regions.

4. The method of claim 3, wherein the metal layer is one selected from the group consisting of a cobalt layer; a titanium layer, a nickel layer, a tungsten layer, a platinum layer, a hafnium layer and a palladium layer.

5. The method of claim 1, wherein the second silicide layer portion is one selected from the group consisting of a cobalt silicide layer, a titanium silicide layer, a nickel silicide layer, a tungsten silicide layer, a platinum silicide layer, a hafnium silicide layer and a palladium silicide layer.

6. The method of claim 5, wherein, when the second silicide layer portion is a cobalt silicide layer or a titanium silicide layer, the step of forming the second silicide layer portion comprises the steps of:

forming a metal layer formed of cobalt or titanium on the entire surface of the resultant structure in which the second source/drain extension regions are exposed so that a silicide layer is naturally formed between the metal layer and each of the second source/drain extension regions;

transferring the phase of the naturally formed silicide layer by performing an annealing process; and removing the metal layer that has not reacted with the second source/drain extension regions.

* * * * *